United States Patent [19]

Cuman et al.

[11] Patent Number: 4,792,885
[45] Date of Patent: Dec. 20, 1988

[54] CONTROL DEVICE OF THE TRANSISTOR BASES OF AN INVERTER ARM

[75] Inventors: Sylvain Cuman, Champagnier; Philippe J. Moreau, Voiron, both of France

[73] Assignee: Merlin Gerin, Grenoble, France

[21] Appl. No.: 93,623

[22] Filed: Sep. 8, 1987

[30] Foreign Application Priority Data

Sep. 15, 1986 [FR] France .............................. 86 112962
Sep. 15, 1986 [FR] France .............................. 86 112963

[51] Int. Cl.$^4$ ........................................... H02M 3/335
[52] U.S. Cl. ........................................ 363/16; 363/56; 363/95; 363/134; 361/91
[58] Field of Search .................. 363/16, 20, 56, 95, 363/133, 134; 361/91, 16

[56] References Cited

U.S. PATENT DOCUMENTS

| | | | |
|---|---|---|---|
| 3,467,852 | 9/1969 | Murray et al. | 363/134 |
| 4,367,418 | 1/1983 | Faust et al. | 361/91 |
| 4,464,709 | 8/1984 | Barter | 363/16 |
| 4,651,267 | 3/1987 | Nguyen et al. | 363/56 |
| 4,672,524 | 6/1987 | Toriyama et al. | 363/56 |
| 4,685,040 | 8/1987 | Steigerwald et al. | 363/56 |

FOREIGN PATENT DOCUMENTS 0108662 5/1984 European Pat. Off. .
2441290 6/1980 France .

OTHER PUBLICATIONS

Patent Abstracts of Japan, vol. 7, No. 247 E-208 (1392) Nov. 1983.
Control Engineering, vol. 28, No. 8, Aug. 1981, pp. 129-136.

*Primary Examiner*—Patrick R. Salce
*Assistant Examiner*—Anita M. Ault
*Attorney, Agent, or Firm*—Parkhurst, Oliff & Berridge

[57] ABSTRACT

An inverter arm is made up of two transistors electrically connected in series, each transistor having its own independent control unit. The control units are supplied by a common power supply unit ensuring galvanic insulation by means of a transformer with two distinct secondary windings. This galvanic insulation allows a potential difference of several hundred volts between the transistors and their control circuit.

8 Claims, 4 Drawing Sheets

CONTROL DEVICE OF THE TRANSISTOR BASES OF AN INVERTER ARM

BACKGROUND OF THE INVENTION

The invention relates to a control device of two bipolar transistors connected ins eries between conductors of a direct operating voltage supply and having a center output point to form an inverter arm, each transistor having a base control unit supplied by a direct control voltage source.

To each phase of the inverter there corresponds an arm having two transistors in series subjected to the operating voltage which generally reaches several hundred volts. Each transistor has associated with it a base control capable of supplying a base current of several amps at a low voltage, notably a few volts, to make the transistor conducting and a low negative voltage blocking the transistor. These control voltages are generally speaking derived from the high operating voltages, which gives rise to insulation problems in the case of the inverter arm with two transistors connected in series.

SUMMARY OF THE INVENTION

The object of the invention is to achieve a simplified control of the transistor of an inverter arm capalbe of withstanding the high operating voltages.

The device according to the invention is characterized in that the two control units are galvanically separated and connected to a same power supply unit having a transformer with a common primary winding, connected to said operating voltage, and with two distinct secondary wingins, each winding supplying one of the control units via rectifiers.

Each transistor is provided with its own control unit at the potential of the transistor and the two control units are supplied by a single power supply unit, which respect the galvanic insulation of the two control units, by means of a power supply transformer with two independent secondary windings, each operating in conjunction with one of the control units. This galvanic separation ensures that the voltage difference of several hundred volts, to which the two conical units of the two transistors are subjected, is withstood. The power supply transformer comprises a primary winding common to the two secondary windings and voltage regulation is performed by a regulator comprising a static switch inserted in the transformer primary circuit. This static switch is controled by a tertiary winding of the transformer via a device causing the static switch to open periodically to regulate the output voltage. Each secondary winding comprises a center tap and diode rectifiers are connected to the end terminals of this secondary winding to supply the positive and negative control voltages, respectively for conducting and blocking the transistor.

Another object of the invention consists in providing protection of the transistor against overvoltages and this objective is achieved by connecting a capacitor in series with a diode to the terminals of the transistor, between the collector and the emitter. Any overvoltage occurring at the transistor terminals is branched off into the shunt circuit formed by the diode and capacitor, the latter absorbing the overvoltage by charging. The capacitor is discharged by means of a resistive circuit connecting the capacitor to the operating voltage supply of opposite polarity.

In a preferred embodiment of the invention, each control unit comprises means of selectively connecting the associated transistor base via a resistor to a positive control voltage supply to make the transistor conducting and of connecting the transistor base to a negative control voltage supply to block the transistor, said connecting means of the transistor base to the positive voltage supply comprising, connected in series, a current regulator delivering a constant current and an energy storage inductor to increase the rise speed of the transistor base current on a conduction order and to counteract the emitter interference inductance.

The current regulator accurately defines the value of the base current ensuring conduction of the transistor, whereas the inductor counteracts or cancels the interference effect of the emitter impedance, this inductor constituting an energy store available when the transistor becomes conducting. The current regulator advantageously comprises a current sensor which controls a regulating amplifier controling a static switch inserted in the base control circuit. Blocking of the transistor is achieved by closing of a static switch which branches the current delivered by the current regulator off to the voltage supply by simultaneously establishing a negative base current via a resistor to the negative voltage supply. This negative voltage supply polarizes the transistor base to keep the latter blocked.

BRIEF DESCRIPTION OF THE DRAWINGS

Other advantages and features will become more clearly apparent from the following description of an illustrative embodiment of the invention, given as a non-restrictive exmaple only and represented in the accompanying drawings, in which.

DESCRIPTION OF THE PREFERRED EMBODIMENTS

Figure 1:
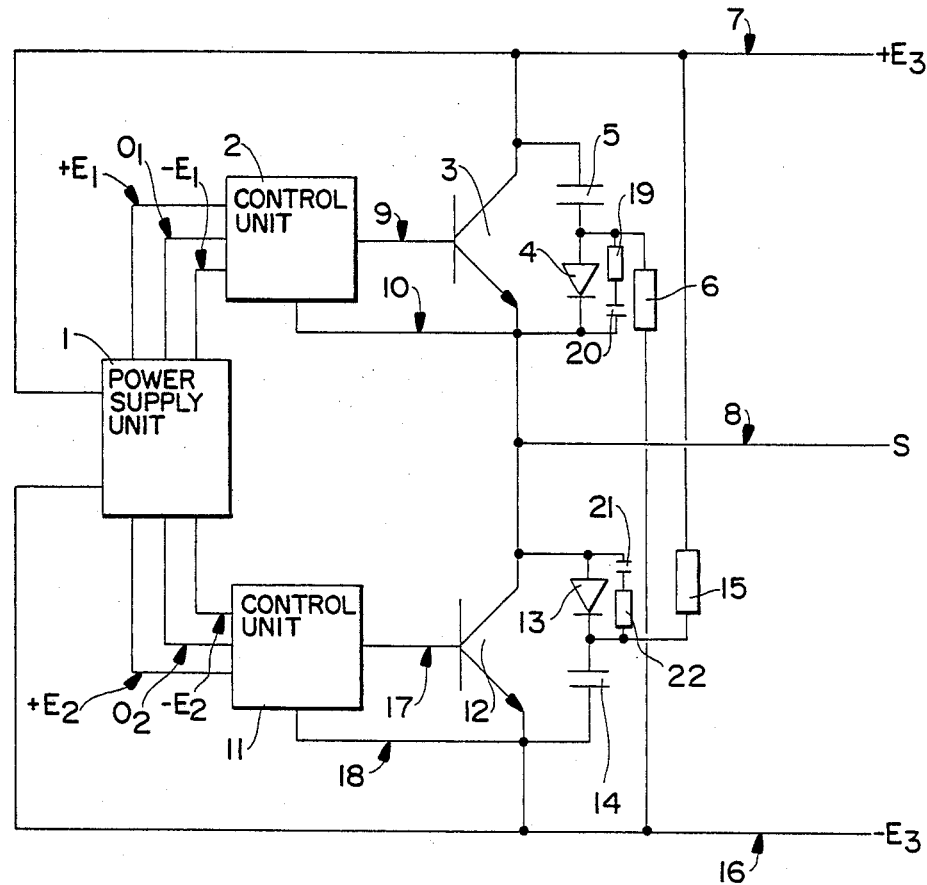
FIG. 1 represents the wiring diagram of an inverter arm with two transistors with their control circuit.
Figure 2:
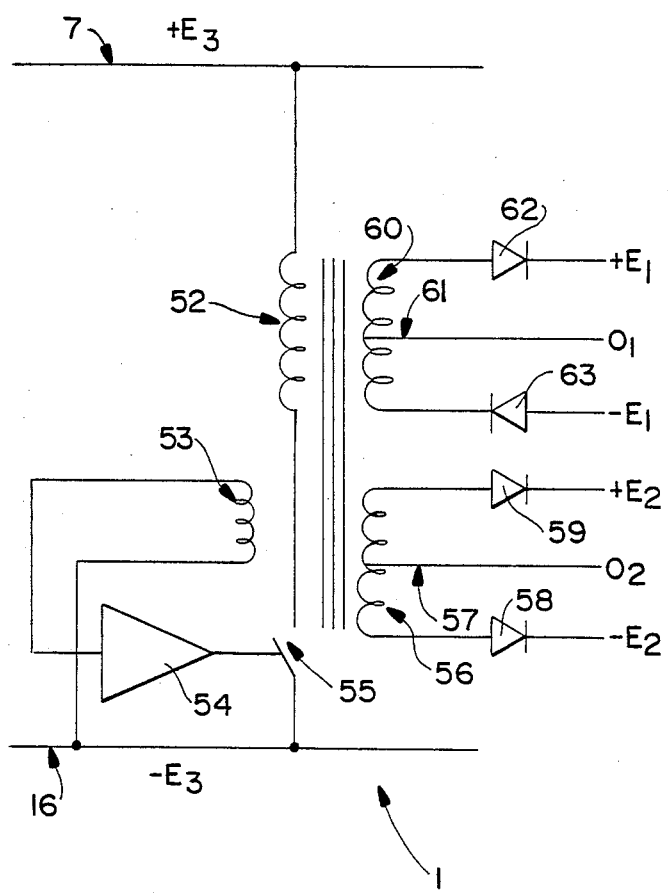
FIG. 2 represents the wiring diagram of the power supply unit of the control circuits according to FIG. 1.

A high D.C. electrical voltage $+E3$, $-E3$ is applied to conductors 7, 16 by a voltage source (not represented), for example a battery or a rectifier. An iverter arm made up of two power transistors 3, 12 electrically connected in series is connected to the conductors 7, 16 and an output conductor 8 is connected to the connecting point of the two transistors 3, 12. When the transistor 3 connected to the $+E3$ voltage is conducting, the output S goes to the $+E3$ potential whereas when the transistor 12 is conducting, this point goes to the $-E3$ potential in a manner well known in the art. Each transistor 3, 12 is connected to a control unit 2, 11, on the one hand by a conductor 9, 17 connecting the base of the transistor to the control unit 2, 11 and on the other hand by a conductor 10, 18 connecting the emitter of the transistor 3, 12 to the control unit 2, 11. The control units 2, 11, which will be described in detail further on, control the alternate conduction and blocking of the transistors 3, 12 to generate an A.C. voltage on the output conductor 8. The D.C. voltage $+E3$, $-E3$, which can reach several hundred volts, is also applied to a power supply unit 1 supplying a power supply voltage of a few volts to the control units 2, 11. Referring more particularly to FIG. 2, it can be seen that the power supply unit 1 comprises a transformer whose primary winding 52 is connected to the conductors 7, 16, a static switch 55 being inserted in the primary circuit. The static switch 55 belongs to a voltage regulator of a known type, represented very schematically in the figure and comprising a tertiary winding 53 of the transformer which controls a device 54 controling the static switch 55. The transformer comprises two distinct secondary windings 56, 60, each having a center tap 57, 61 supplying the control output 0 voltage 01, 02. The ends of the secondary windings 56, 60 supply the output voltages $+E1$, $-E1$; $+E2$, $-E2$ via diode rectifiers 58, 59; 62, 63. These control voltages delivered by the transformer are a few volts, in this case only a fraction of the operating voltage $+E3$, $-E3$. The control voltages $+E1$, 01, $-E1$ delivered by the secondary winding 60 supply the control unit 2 of the transistor 3 whereas the voltages $+E2$, 02, $-E2$ delivered by the secondary winding 56 supply the control unit 11 of the transistor 12. The separation of the secondary windings 56, 60 ensures insulation between the control units 2, 11 which can be at different high potentials.

A shunt circuit comprising a capacitor 5 and a diode 4 electrically connected in series is connected to the terminals of the transistor 3, the capacitor 5 being connected on the one hand to the controller of the transistor 3, and on the other hand to the anode of the diode 4 whose cathode is connected to the emitter of the transistor 3. The connecting point of the capacitor 5 and of the anode of the diode 4 is further connected by a resistor 6 to the $-E3$ voltage conductor 16. There is connected to the terminals of the diode 4 a circuit comprising a resistor 19 and a capacitor 20. Similarly, the transistor 12 is shunted by a circuit comprising a diode 13 and a capacitor 14, the anode of the diode 13 being connected to the collector of the transistor 12 whereas the capacitor 14 is connected to emitter of the transistor 12. The connecting point between the diode 13 and the capacitor 14 is connected by a resistor 15 to the $+E3$ voltage conductor 7. The diode 13 is shunted by a circuit comprising a resistor 22 and a capacitor 21. The shunt circuit with capacitors 5, 14 and diodes 4, 13 in series protects the transistor 3, 12 against overvoltages, the resistor 6, 15 keeping the capacitor 5, 14 charged.

Figure 3:
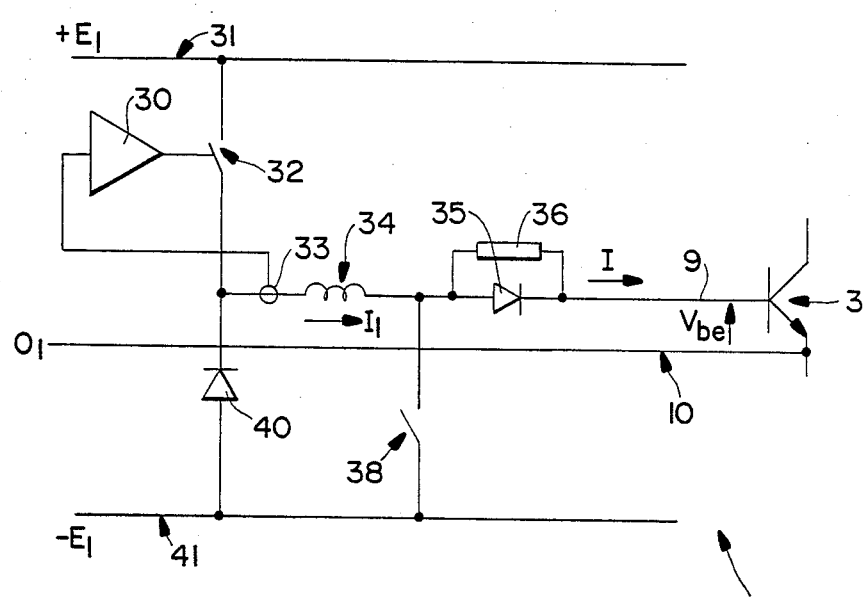
FIGS. 3 and 4 represent the wiring diagram of a transistor control unit respectively in the conducting and blocking position.

Only the control unit 2 associated with the transistor 3 is described hereafter referring to FIG. 3, the control unit 11 of the transistor 12 being strictly identical. The base of the transistor 3 is connected to the conductor 31 at $+E1$ voltage by a circuit 9 comprising a static switch 32, an inductor 34 and a diode 35 electrically connected in series. The diode 35 is shunted by a resistor 36. The static switch 32 belongs to a current regulator comprising a sensor 33, which controls a regulating amplifier 30 which controls the static switch 32. When the $+E1$ and $-E1$ voltages are applied to the conductors 31 and 41, when the circuit is started up, the static switch 32 is normally closed and the current flowing through the sensor 33 increases up to a first threshold, called the upper threshold. As soon as this threshold is reached, the regulating amplifier 30 causes the static switch to open and the current flowing through the sensor decreases until it reaches a second threshold, called the lower threshold, bringing about reclosing of the static switch. The current regulator output current therefore varies between the two above-mentioned threshold values in such a way that its mean value is maintained constant. This current regulator 30, 32, 33 therefore delivers a constant current I1 to control conduction of the transistor 3. The emitter of the transistor 3 is connected to the 0 voltage, 01 and the connecting point of the inductor 34 and of the anode of the diode 35 is connected by a static switch 38 to the conductor 41 at $-E1$ control voltage. The anode of a return diode 40 is connected to the conductor 41 at $-E1$ voltage, the cathode of this diode being connected to the connecting point of the static switch 32 and of the inductor 34.

Figure 4:
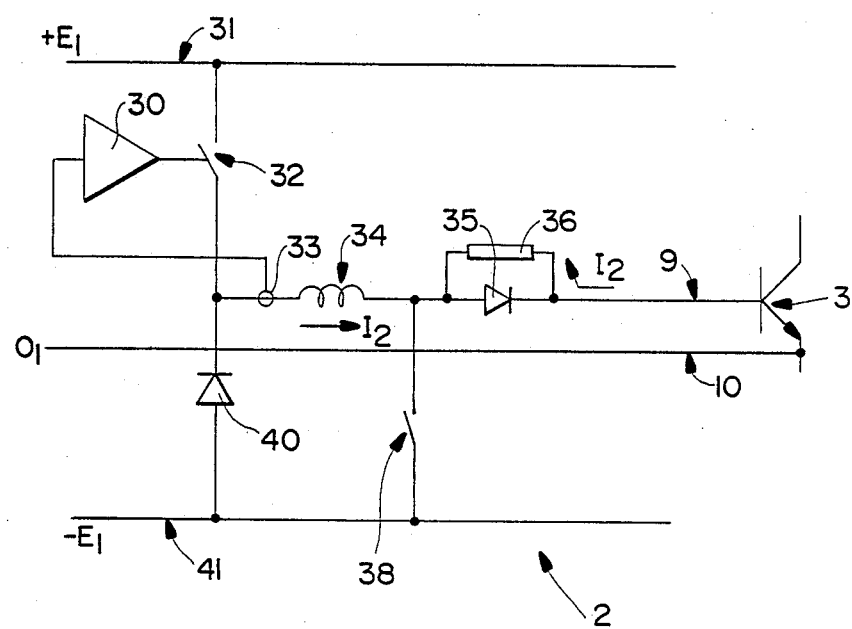

In the open position of the static switch 38, represented in FIG. 3, the current I1, kept at a constant value by the current regulator 30, 32, 33, recloses via the inductor 34, the diode 35 and the base of the transistor 3 in the power supply 01. The transistor 3 is conducting, the diode 40 ensuring the current feedback during the blocking phases of the switch 32. In the closed position of the switch 38, represented in FIG. 4, the current I1 is drawn off by this switch 38 to the conductor 41, whereas a negative base direct current I2 is established via the resistor 36 and the switch 38 to the conductor 41. This negative direct current causes blocking of the transistor 3. The base of the transistor 3 is polarized via the resistor 36 at the voltage $-E1$ keeping the transistor 3 blocked.

It is worthwhile recalilng that control of a transistor base imposes the following conditions:
  (1) delivering a positive direct control current of a precise value I1 during the transistor conduction time;
  (2) achieving a fast base current rise time at the moment the transistor becomes conducting;
  (3) achieving a fast base current fall time at the moment the transistor is blocked;
  (4) delivering a negative direct current I2 of a precise value during the transistor base blocking time;
  (5) applying a negative direct voltage $-E1$ during the time the transistor is blocked.

The emitte circuit of the transistor 3 presents an interference inductance which tends to oppose the establishment of the base current IB making the transistor 3 conducting. According to the present invention, this interference inductance is counteracted by the inductor 34 which constitutes an energy store impsoing a high-speed increase of the base current IB when the switch 38 opens, in spite of the presence of the emitter interference inductance The value of the current I1 is determined with accuracy by the current regulator 30, 32, 33. It is worthwhile noting that the control current I1 which can reach several amps does not flow through any resistors and that the power dissipated in the control circuit is particularly low and a fraction of that of standard control circuits. The switches 38 of the control circuits 2, 11 are controlled by standard devices to make the transistors 3, 12 alternately conducting and to generate an alternating current of predetermined frequency. It is pointless describing these control circuits of the switches 38 which may be of any kind.

Figure 5:
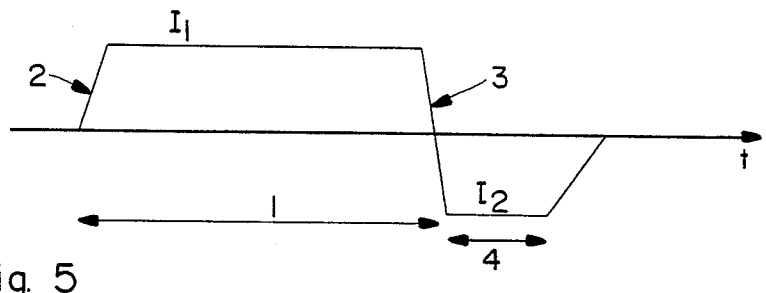
FIG. 5 shows the variation of the base control current of a transistor according to FIG. 1.
Figure 6:
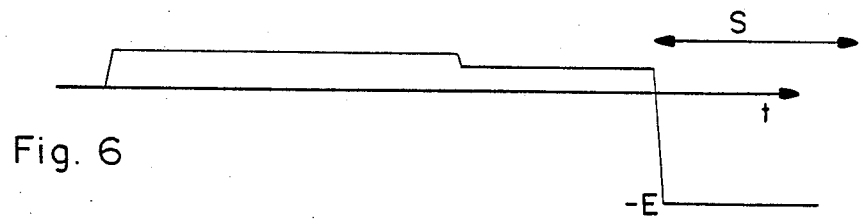
FIG. 6 illustrates the variation of the transistor emitter base voltage.

FIGS. 5 and 6 illustrate respectively the variation of the base current IB and of the emitter base voltage of the transistor 3 confirming that the conditions set out above are met.

We claim:
1. A control device comprising:
  a first and a second bipolar transistor connected in series, and connectable between first and second conductors of a D.C. voltage supply, a center point between said first and second bipolar transistors forming an inverter output;

first and second base current control units connected to bases of a respective one of said first and second bipolar transistors, said control units each being supplied by a control voltage source, and each being referenced to a different ground potential;

a power supply unit including a transformer having a primary winding connectable to said conductors of said D.C. voltage supply, and first and second separate secondary windings, each second winding supplying, through respective rectifiers, a respective one of the control units with a substantially constant D.C. control voltage, said power supply unit further comprising a voltage regulator including a tertiary winding of said transformer, a device controlled by the tertiary winding and a switch in series with said primary winding, said switch being controlled by said device.

2. The device according to claim 1, wherein each secondary winding comprises first and second ends and a center tap for delivering a positive D.C. control voltage between the first end and the center tap, and a negative D.C. control voltage between the second end and the center tap.

3. The device according to claim 2, wherein each control unit comprises a base current switch having first and second positions for applying a base current to the respective bipolar transistor when said base current switch is in the first position and for removing the base current from the respective bipolar transistor when the base current switch is in the second position.

4. The device according to claim 1, further comprising an overvoltage limit circuit, connected between a collector and an emitter of each bipolar transistor, said overvoltage circuit including a capacitor in ser5ies with a diode and a resistor connected to a common point between the capacitor and diode and connectable to said conductor of said D.C. voltage supply to which the other bipolar transistor is connectable.

5. The device according to claim 4, further comprising a shunt circuit including a resistor and capacitor in series, connected across each of said diodes.

6. A control device comprising:

a first and a second bipolar transistor connected in series, and connectable between first and second conductors of a D.C. voltage supply, a center point between said first and second bipolar transistors forming an inverter output; and first and second base current control units connected to bases of a respective one of said first and second bipolar transistors, said control units each being supplied by a control voltage source, and each being referenced to a different ground potential, each control unit including means for selectively connecting a base of the respective bipolar transistor to a positive D.C. control voltage supply through a resistor to turn the respective bipolar transistor on and for connecting said base of the respective bipolar transistor to a negative D.C. control voltage supply to turn the respective bipolar transistor off said means for selectively connecting including a current regulator for delivering a constant current, connected in series with an energy storage inductor, said current regulator comprising a sensor of the current flowing through the inductor, a regulating amplifier controlled by said sensor and a switch controlled by said amplifier to maintain a mean base current at a constant value;

a power supply unit including a transformer with a primary winding connectable to said D.C. voltage supply and first and second separate secondary windings, each second winding supplying, through respective rectifiers, a respective one of the control units with a substantially constant D.C. control voltage.

7. The device according to claim 6, wherein said resistor is connected between the inductor the base of the respective bipolar transistor, and a diode is connected in parallel with said resistor, the connecting point between the inductor and resistor being connected to said negative D.C. control voltage supply through a static control switch.

8. The device according to claim 6, wherein the connection between the inductor and regulator is connected by a diode to the negative D.C. control voltage supply.

* * * * *